United States Patent [19]

Shimada et al.

[11] Patent Number: 5,049,954
[45] Date of Patent: Sep. 17, 1991

[54] GAAS FIELD EFFECT SEMICONDUCTOR DEVICE HAVING SCHOTTKY GATE STRUCTURE

[75] Inventors: Kizashi Shimada, Yokohama; Tatsuo Akiyama, Tokyo; Yutaka Koshino, Hyogo, all of Japan

[73] Assignee: Kabushiki Kaisha Toshiba, Kawasaki, Japan

[21] Appl. No.: 446,467

[22] Filed: Dec. 5, 1989

[30] Foreign Application Priority Data

Dec. 7, 1988 [JP] Japan ................................. 63-309368

[51] Int. Cl.⁵ ....................... H01L 29/48; H01L 29/56
[52] U.S. Cl. .......................................... 357/15; 357/22; 357/71
[58] Field of Search ................... 357/71 T, 71 S, 67 S, 357/22 I, 22 J, 22 B, 15

[56] References Cited

U.S. PATENT DOCUMENTS 4,574,298  3/1986  Yamagishi et al. ................. 357/22 I

FOREIGN PATENT DOCUMENTS

| 275905A | 7/1988 | European Pat. Off. | 357/22 I |
| 2550889 | 8/1983 | France | 357/15 |
| 59-98553 | 6/1984 | Japan | 357/71 T |
| 59-119867 | 7/1984 | Japan | 357/71 T |
| 61-16577 | 1/1986 | Japan | 357/22 I |
| 62-259474 | 11/1987 | Japan | 357/71 T |
| 63-258066 | 10/1988 | Japan | 357/71 T |

OTHER PUBLICATIONS

C. Canali et al., "Gate Metallization 'Sinking' into the Active Channel in Ti/W/Au Metallized Power MESFET's," IEEE Election Device Letters, vol. EDL-7, No. 3, Mar. 1986.
H. Matsuura et al., "Thermally Stable Schottky Contact to n-GaAs Using W-Al Alloy and Al/W Two Layer Metal," Extended Abstracts of the 16th (1984 International) Conference on Solid State Devices and Materials, Kobe, 1984, pp. 379-382.
Y. Kuriyama et al., Shingaku Technical Report, ED 86-49, "Effect of Si Thin Interfacial Layer on W/GaAs Schottky Barrier Contact".

Primary Examiner—Rolf Hille
Assistant Examiner—Minhloan Tran
Attorney, Agent, or Firm—Finnegan, Henderson, Farabow, Garrett, and Dunner

[57] ABSTRACT

A Schottky gate electrode structure of a GaAs field effect semiconductor device comprises a Ti film having a thickness of 2 nm to 25 nm and provided adherently on a GaAs substrate including source and drain regions, and a refractory electrode film provided on the Ti film and formed of a material selected from W, Mo, Cr, Ta, Nb, V, Hf, Zr, nitrides of these metals, silicides of these metals, carbides of these metals, Ti-W alloys, WSixNy, TiNx, and TiSix. Adhesion of the refractory electrode film to the GaAs substrate is increased, and heat resisting properties of Schottky characteristics are improved according to the thin Ti film.

3 Claims, 4 Drawing Sheets

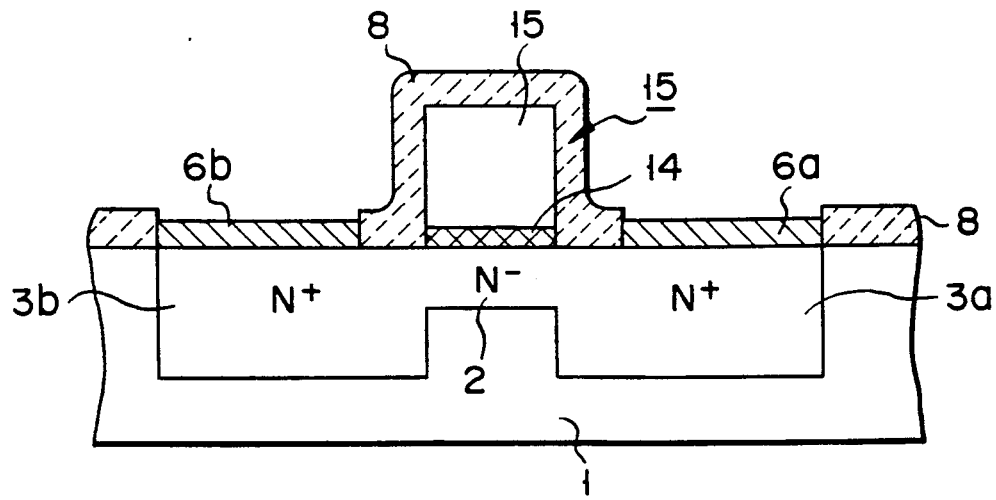
F I G. 1
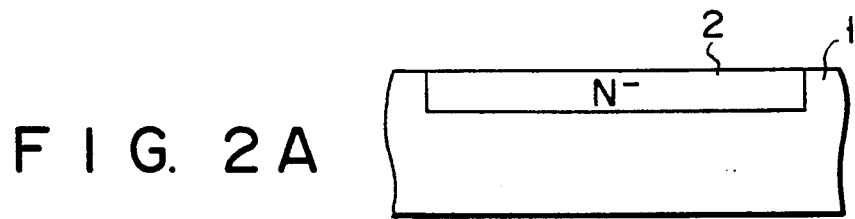
F I G. 2A
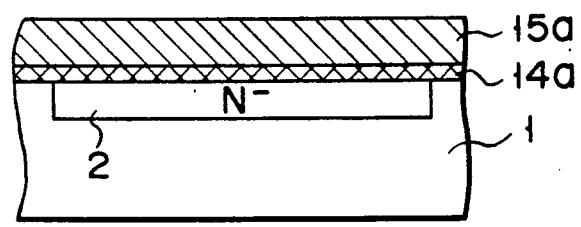
F I G. 2B
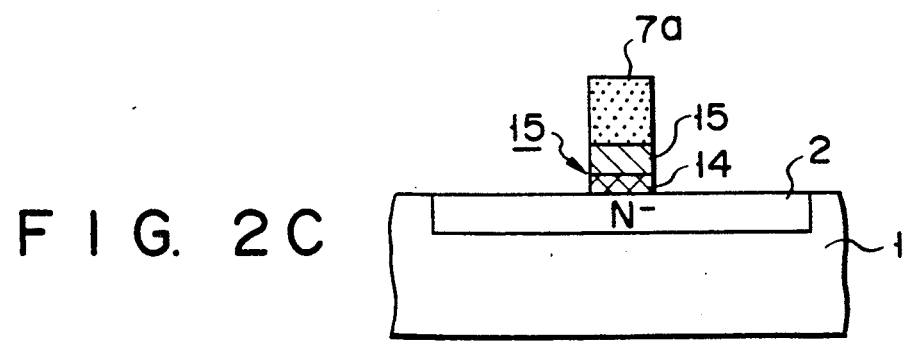
F I G. 2C

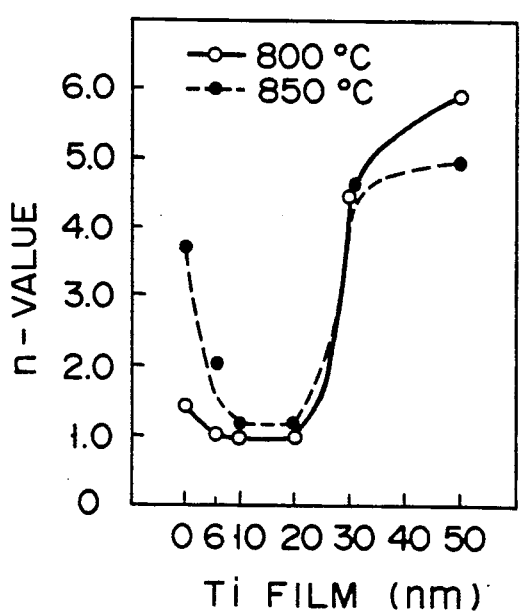
F I G. 4
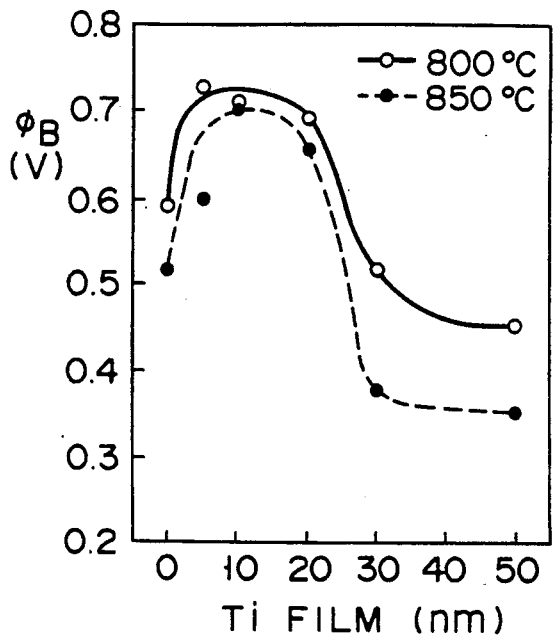
F I G. 5
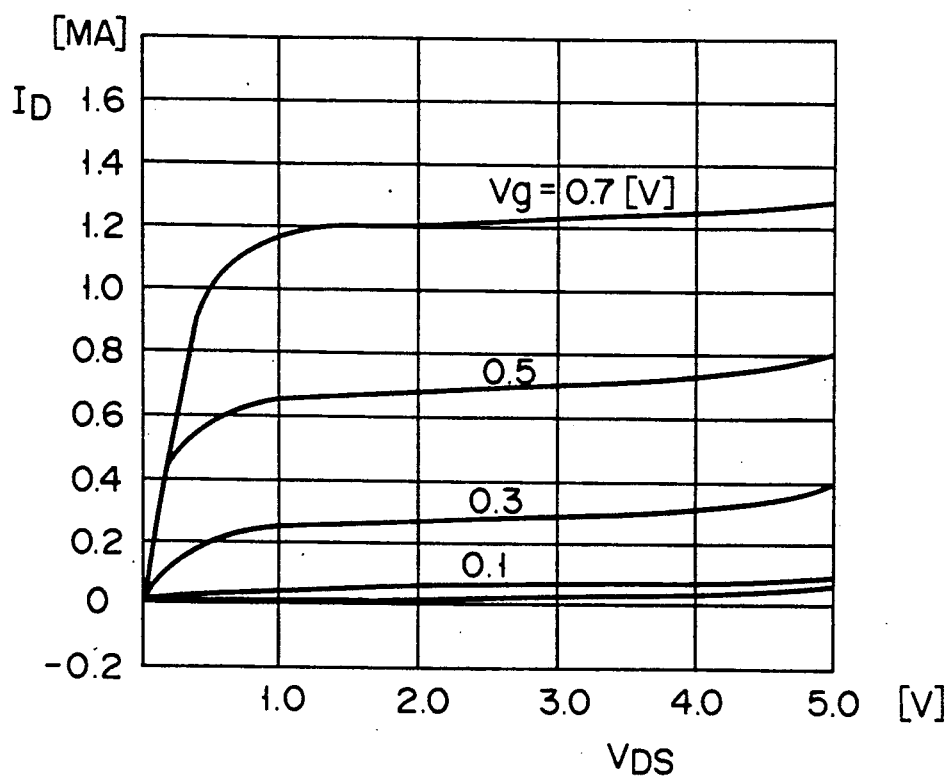
F I G. 6

GAAS FIELD EFFECT SEMICONDUCTOR DEVICE HAVING SCHOTTKY GATE STRUCTURE

BACKGROUND OF THE INVENTION

1. Field of the Invention

The present invention relates generally to a material of a gate electrode of a field effect semiconductor device (hereinafter, referred to as "FET"), and more particularly to a Schottky gate electrode structure of a GaAs FET.

2. Description of the Related Art

A pellet of a conventional GaAs FET, for example, a GaAs Schottky gate field effect transistor (hereinafter, referred to as "MESFET") has a cross section as shown in FIG. 8. An Al layer 4 having a thickness of about 2 nm is formed, by means of an evaporating or sputtering method, on the surface of an N-type low-concentration impurity region ($N^-$type channel region) 2 that is formed in a GaAs semi-insulating substrate 1, and a W (tungsten) film 5 is then formed on the Al layer 4 by means of an evaporating or sputtering method thereby providing a gate electrode 5. Reference numeral 3 indicates source and drain regions which are formed such that, after a desired impurity is ion-implanted in the substrate 1 by a self-alignment process with use of the gate electrode 5 as a mask, the substrate 1 is subjected to a heat treatment. Numeral 6 denotes source and drain electrodes which are in ohmic contact with the $N^{30}$-type source and drain regions 3.

It is necessary that the gate electrode be formed of a material which does not deteriorate electrical characteristics of a Schottky junction, even under a high temperature heat treatment carried out after the ion implantation. Thus, refractory metal base compounds are used as the gate electrode materials. As heat-resistant gate electrode materials, materials such as $WSi_x$, $WN_x$, TiW, $TiWN_x$, and the like are well known.

The conventional refractory electrode materials have a bad adhesion to GaAs substrate. The gate electrode formed of such materials may be peeled off after the implanted layer is activated by the heat treatment. Also, if the thickness of an electrode layer is increased to obtain lower resistance, the electrode layer may be peeled off due to an internal stress of the material itself. Therefore, it is difficult to obtain low resistance of the electrode layer by increasing it moreover, the limit value of heat resisting temperature for Schottky characteristics is about 800° C.

As has been described above, it is imperative that the gate electrode of a GaAs FET be formed of a material which does not deteriorate Schottky characteristics (e.g., a Schottky barrier height $\phi B$, an ideality factor n-value, etc.) due to the high-temperature heat treatment during the manufacturing process. Also, the gate electrode must be formed of a material having physically high adhesion to GaAs substrate. In the prior art, however, the gate electrode is often peeled off and Schottky characteristics are deteriorated due to the heat treatment (about 800° C), e.g., for activating the source and drain regions, which is performed after the gate electrode has been formed.

SUMMARY OF THE INVENTION

An object of the present invention is to provide a GaAs field effect semiconductor device having a gate electrode whose adhesion to a GaAs substrate is remarkably increased.

Another object of the invention is to provide a GaAs field effect semiconductor device having a gate electrode which does not deteriorate electrical characteristics of a Schottky junction even under a given high temperature heat treatment, and which can have excellent heat resisting properties.

A GaAs field effect semiconductor device according to the present invention includes a gate electrode comprising a Ti film having a thickness of 25 nm or less and provided adherently on a GaAs substrate, and a refractory electrode film provided on the Ti film and selected from W (tungsten), Mo (molybdenum), Cr (chromium), Ta (tantalum), Nb (niobium), V (vanadium), Hf (hafnium), Zr (zirconium), Ti-W (titanium-tungsten alloy), nitrides of these metals, silicides of these metals, carbides of these metals, $WSi_xN_y$ (tungsten silicide nitride), $TiN_x$ (titanium nitride), and $TiSi_x$ (titanium silicide).

In the above-mentioned compounds, x and y are positive numbers including decimal. The gate electrode may be a multilayer gate electrode wherein a portion of a wiring electrode film for a bonding pad is provided on the above-described two-layer structure.

The present invention relates to a semiconductor device having a gate electrode structure wherein a Ti film with a thickness of 25 nm or less is interposed between a refractory material (a second refractory electrode film of W, Mo, etc.) and a GaAs substrate. The adhesion of the refractory material to the GaAs substrate is increased, and the heat resisting properties of Schottky characteristics are improved.

According to results of experiments (described later), if a Ti thin film with a thickness of, e.g., about 2 nm is placed between the GaAs substrate and the refractory gate electrode film, the adhesion of the gate electrode film increases remarkably and the gate electrode film is not peeled off. If the thickness of the Ti film is increased, the adhesion of the gate electrode film gradually decreases. However, in this case, the gate electrode film is hardly peeled off during the manufacturing process, and sufficient adhesion can be attained.

The electrical characteristics of a Schottky junction formed between the gate electrode and the GaAs substrate are deteriorated by a high-temperature heat treatment (e.g., 800° C. to 850° C.), depending greatly upon the thickness of the Ti film interposed between the gate electrode film and the substrate. According to the results of the experiments, which will be described later, an ideal factor, i.e., n-value, of an I-V characteristic of the Schottky junction and a Schottky barrier height $\phi B$ are remarkably deteriorated by the heat treatment when the Ti film thickness exceeds 25 nm.

In other words, if the Ti thin film is interposed between the GaAs substrate and the refractory gate electrode film, the adhesion of the gate electrode to the substrate remarkably increases. However, the Ti film thickness is limited by the degree of deterioration in Schottky characteristics. It is desirable that the Ti film thickness be 25 mn or less. Desirable refractory materials are metals or compounds, such as W, $WN_x$, $WSi_x$, $WSi_xN_y$, $WC_x$, Mo, $MoN_x$, $MoSi_x$, $MoC_x$, Ta, $TaN_x$, $TaSi_x$, Zr, $ZrN_x$, Hf, $HfN_x$, $TiN_x$, $TiSi_x$, Cr, Nb, $NbN_x$, V, and $VN_x$.

BRIEF DESCRIPTION OF THE DRAWINGS

The novel and distinctive features of the invention are set forth in claims appended to the present application. The invention itself, however, together with further objects and advantages thereof may be best be understood by reference to the following description and accompanying drawings in which:

FIG. 1 is a cross-sectional view of a semiconductor device according to an embodiment of the present invention;

FIGS. 2A–2F show cross sectional views for illustrating steps of manufacturing the semiconductor device shown in FIG. 1;

FIGS. 4 and 5 show, respectively, the dependencies of the n-value and $\phi$B of Schottky characteristics upon the Ti film thickness;

FIG. 6 shows an example of static characteristics of a MESFET of the invention;

DETAILED DESCRIPTION OF THE PREFERRED EMBODIMENT

Figure 8:
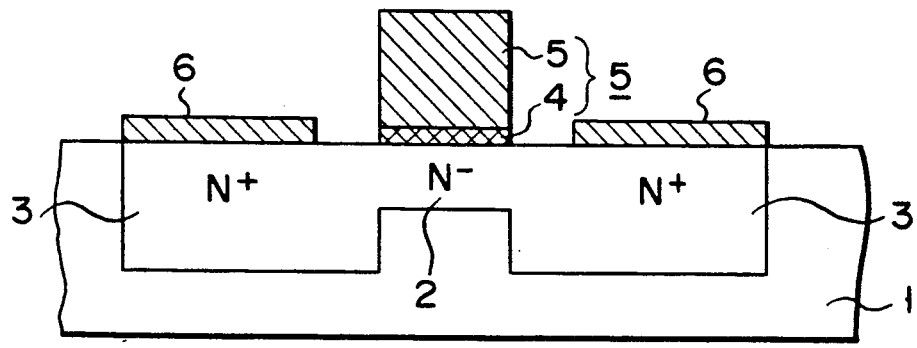
FIG. 8 is a cross-sectional view of a conventional semiconductor device.

FIG. 1 is a cross-sectional view of a GaAs MESFET according to the present invention. The reference numerals, which have been used in FIG. 8, denote the same structural elements. Reference numeral 15 denotes a gate electrode consisting of a Ti film 14 having a thickness of 6 nm and adhered on an N-type channel region 2 of a GaAs semiconductor substrate 1, and a WNx film 15 having a thickness of 200 nm laminated on the Ti film 14. Numerals 3a and 3b denote N$^{30}$-type drain and source regions, numerals 6a and 6b drain and source electrodes being in ohmic contact with the drain and source regions 3a and 3b, and numeral 8 a silicon nitride (SiNx) film.

Figure 2D:
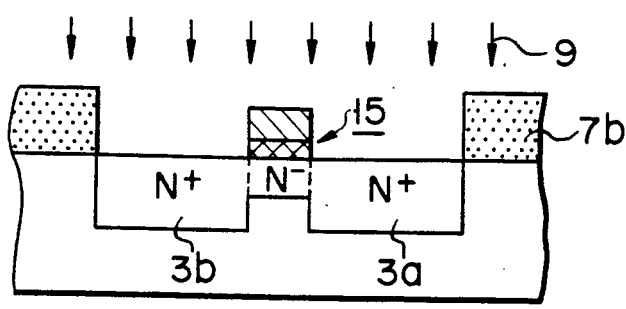
Figure 2E:
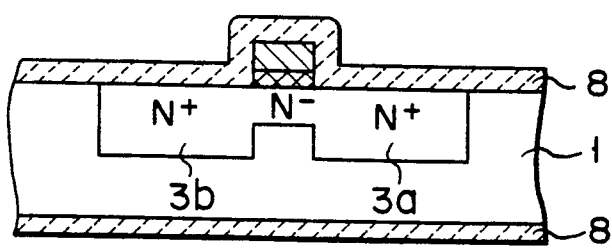
Figure 2F:
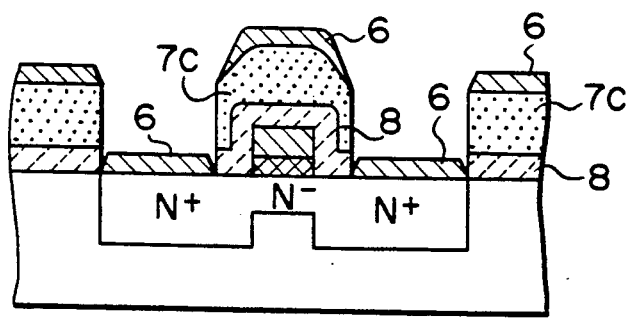

A method of manufacturing the MESFET of the present invention will now be described with reference to FIGS. 2(a) to 2(f) and FIG. 1. First, as shown in FIG. 2(a), an N$^-$-type channel region 2 with low impurity concentration is formed in a desired region of the GaAs semi-insulating substrate 1, by using a $^{29}$Si$^+$ ion implantation technique. Then, as shown in FIG. 2(b), for example, a Ti film 14a having a thickness of 6 nm and a WNx film 15a having a thickness of 200 nm are successively deposited on the substrate by a usual sputtering method, thereby providing a gate electrode. In a step shown in FIG. 2(c), a resist pattern 7a for the gate electrode is formed on the WNx film 15a by a photolithographic technique. With use of the resist pattern 7a as a mask, the resultant structure is subjected to an RIE (reactive ion etching) (CF$_4$+O$_2$) in a vertical direction, thereby forming the gate electrode 15 consisting of the two films, or Ti film 14 and WNx film 15. Thereafter, as shown in FIG. 2(d), by using the gate electrode 15 and a resist 7b as masks, $^{29}$Si$^+$ions, for example, are implanted in a direction of arrows 9, under the conditions of an acceeration voltage of 120 keV and a dose of $3.0 \times 10^-$cm$^{-2}$, thereby forming N-type high impurity concentration drain and source regions 3a and 3b by a self-alignment manner. Subsequently, as shown in FIG. 2(e), plasma SiNx films (silicon nitride films) 8, each having a thickness of about 300 nm, are deposited on main and opposite surfaces of the substrate (wafer) 1. Using plasma SiNx films 8 as anneal protection films, the drain and source regions 3a and 3b are subjected to an activation heat treatment for 15 minutes at 800° C. In a step shown in FIG. 2(f), a window pattern 7c of a resist layer is formed over given regions (source and drain) by a photolithographic technique, and then the substrate is subjected to a CDE (chemical dry etching) process to remove exposed SiNx films 8 from substrate surfaces. An electrode metal film 6 of, e.g., Ni (30 nm thickness)/AuGe(200 nm), is deposited on the exposed main surface of the substrate 1. Finally, unnecessary portions of Ni/AuGe are removed by a lift-off technique, and the resultant structure is subjected to an alloying treatment for 2 minutes at 440° C., thus obtaining the MESFET as shown in FIG. 1.

The following experiments were performed in order to examine the effects of a Ti film with regard to the peeling off a gate electrode. FETs of WNx (200 nm)/GaAs structure, in which WNx was only used as a gate electrode material, and FETs of WNx (200 nm)/Ti (6 nm)/GaAs structure of the above embodiment were manufactured by the above-described process, and they were compared. It was found that, in the former FETs, in which Ti was not used, gate electrodes were often peeled off during the manufacturing process and had low adhesion to WNx substrates. On the other hand, in the latter FETs of the embodiment of this invention, no electrode gates were peeled off from the substrates and had very high adhesion.

Figure 3:
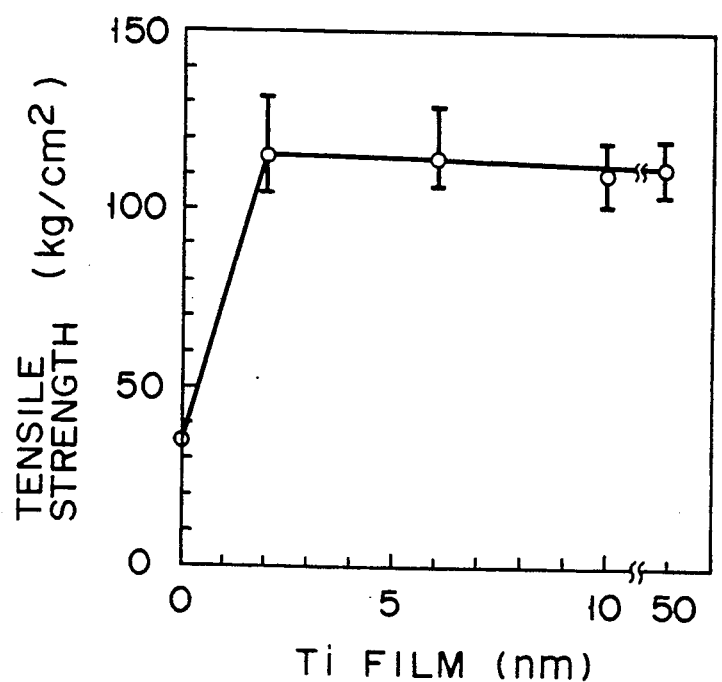
FIG. 3 shows a relationship between the Ti film thickness and the tensile strength in the semiconductor device of the invention.

Further, in order to examine the adhesion quantitatively, the tensile strength of gate electrodes was measured. More specifically, a flat adhesion surface of a pulling jig was attached, by means of adhesive, to a main surface of a gate electrode, and a pulling force was applied to another end of the jig opposite to the flat adhesion surface. Thus, the tensile strength (Kg/cm$^2$) of the gate electrode at the time when the gate electrode was peeled off from the substrate was measured. FIG. 3 shows the results of this experiment. An axis of abscissas indicates the Ti film thickness (nm), and an axis of ordinates indicates the tensile strength (kg/cm$^2$). The value "0" of Ti film thickness is directed to the WNx (200 nm)/GaAs FET, and the other values of Ti film thickness are directed to four FETs of WNx (200 nm)/Ti (2, 6, 10, 50 nm)/GaAs structure. In FIG. 3, symbol ○ indicates an average tensile strength regarding several tens of samples, and vertical lines crossing this symbol ○ indicate fluctuations of tensile strength. From this experiment, it was found that the use of Ti film increased the tensile strength about three times and remarkably increased the adhesion. The increase in thickness of Ti film gradually decreases the average tensile strength, but it indicates substantially constant, excellent adhesion.

FIGS. 4 and 5 show examples of experiments carried out in connection with the dependencies of the ideality factor n-value of Schottky junction and the Schottky barrier height $\phi$B upon the Ti film thickness, after the MESFETs with WNx (200 nm)/Ti (t nm)/GaAs structure were subjected to a high-temperature heat treatment. In FIG. 4, the abscissa indicates the Ti film thickness (nm), and the ordinate indicates the n-value. In FIG. 5, an axis of abscissas indicates the Ti film thickness (nm), and an axis of ordinates indicates the barrier height $\phi$B. The experiments were performed with respect to six cases where the Ti film thicknesses t were 0 nm, 6 nm, 10 nm, 20 nm, 30 nm and 50 nm. In each case, activation processes for implanted ions were performed for 15 minutes at 800° C. (indicated by solid lines and symbol ○) and for 15 minutes at 850° C. (indicated by broken lines and symbol ●).

In FIG. 4, the n-value can be found from a current-voltage characteristic obtained when a forward bias is applied to the Schottky junction. The closer to 1 the n-value, the better. In FIG. 4, where the heat treatment temperature is 800° C., the n-value rises when the Ti film thickness t is 30 nm or 50 nm. The desirable n-value (about 1.05) appears when the thickness t is 6, 10, or 20 (nm). When the thickness t is 0, that is, when WNx is only used, the n-value is 1.3 and is a little undesirable. Where the heat treatment temperature is 850° C., the n-value has a tendency of increase. However, when the thickness t is 6, 10, or 20 (nm), the deterioration in the n-value is negligible.

In general, when a metal layer is used as a gate electrode, it is desirable that the value of Schottky barrier height $\phi B$ shown in FIG. 5 is high. In FIG. 5, where the heat treatment temperature is 800° C., the height $\phi B$ decreases when the Ti film thickness is 30 nm or 50 nm. When the thickness t is 6, 10, or 20 nm, the height $\phi B$ is desirable (0.70 to 0.73 V). When the thickness t is 0, i.e., when the Ti film is not provided, the height $\phi B$ is 0.59 V and slightly decreases. Where the thermal treatment is 850° C., the height $\phi B$ generally decreases. However, when the thickness t is 6, 10, or 20 nm, the height $\phi B$ is satisfactory.

From the results of experiments shown in FIGS. 3 to 5, it was found that the desirable Ti film thickness was 2 nm to 25 nm.

FIG. 6 shows a static characteristic ($I_D-V_{DS}$ characteristic of Vg parameter) of a MESFET of a WNx (200 nm)/Ti (10 nm)/GaAs structure, which has a gate length Lg=2 $\mu$m and a gate width Wg=18 $\mu$m. The k-value per the gate width of 10 $\mu$m is 1.25 mA/V$^2$, and desirable characteristic is obtained.

Figure 7:
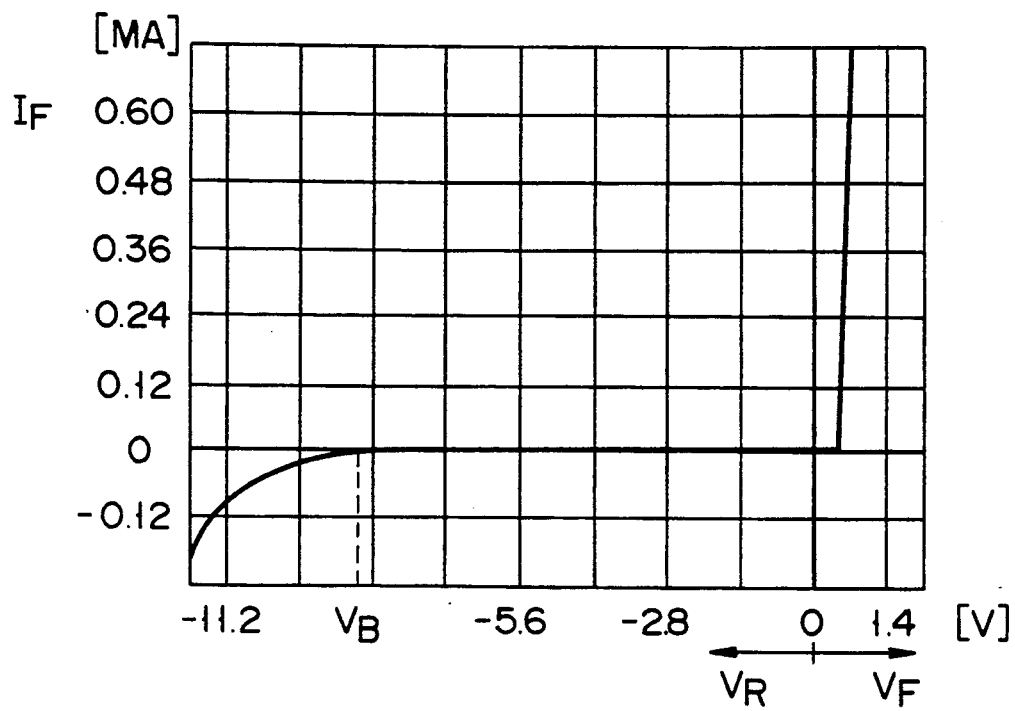
FIG. 7 shows diode characteristics of the Schottky junction of MESFET shown in FIG. 6.

FIG. 7 shows a voltage/current characteristic of the Schottky junction diode, when a forward bias voltage and a reverse bias voltage are applied to the gate electrode of the FET shown in FIG. 6. In FIG. 7, an axis of abscissas denotes a bias voltage V applied to an anode (gate electrode) of a diode, and the positive value indicates a forward bias voltage $V_F$, the negative value indicates a reverse bias voltage $V_R$, and symbol $V_B$ indicates a breakdown voltage. An axis of ordinates denotes a current $I_F$ flowing through the junction. It was found that an excellent diode characteristic was obtained.

The gate electrode having the above structure can be easily manufactured by means of etching using fluorine system gases such as CF$_4$. Thus, the processability of this gate electrode is better than that of the conventional structure having an Al layer.

In the above embodiment, WNx was used as a refractory material. However, with use of other refractory material mentioned above, similar excelent advantageous effects are obtainable. Furthermore, though the above embodiment was directed to the MESFET, the present invention is, of course, applicable to other GaAs FET having a similar Schottky gate structure, such as a HEMT (high-electron mobility transistor).

As has been described above, in the GaAs FET of the present invention wherein a Ti film is interposed between a refractory Schottky electrode material and a GaAs substrate, the adhesion of the gate electrode to the substrate will be increased. In addition, even if the gate electrode is subjected to a predetermined high-temperature heat treatment, the gate electrode having both good electrical characteristics of the Schottky junction and high heat resistance can be obtained.

What is claimed is:

1. A GaAs field effect semiconductor device, comprising:
    a GaAs semiconductor substrate including source and drain regions; and
    a Schottky gate electrode between the source and drain regions of said GaAs semiconductor substrate, said Schottky gate electrode including:
    a Ti film having a thickness of greater than or equal to 2 nm and less than or equal to 25 nm, and
    a refractory electrode film on said Ti film.

2. The GaAs field effect semiconductor device of claim 1, in which said refractory electrode film includes a material selected from W, Mo, Cr, Ta, Nb, V, Hf, Zr, nitrides of these materials, silicides of these materials, carbides of these materials, Ti-W alloys, Wsi$_x$N$_y$, TiN$_x$, and TiSi$_x$.

3. The GaAs field effect semiconductor device of claim 1, further comprising a silicon nitride film on said Schottky gate electrode.

* * * * *